(12) United States Patent
Gosser et al.

(10) Patent No.: US 6,529,078 B1
(45) Date of Patent: Mar. 4, 2003

(54) LOW-DISTORTION TRANSIMPEDANCE AMPLIFIER STRUCTURES AND METHODS

(75) Inventors: Royal A. Gosser, Greensboro, NC (US); Edward Perry Jordan, Kernersville, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/935,263

(22) Filed: Aug. 22, 2001

(51) Int. Cl.[7] ............................................... H03F 3/45
(52) U.S. Cl. ...................... 330/255; 330/283; 330/268; 327/66
(58) Field of Search ................................ 330/255, 252, 330/253, 254, 257, 283, 260, 261, 263, 264, 265, 267, 268, 269; 327/53, 66, 103

(56) References Cited

U.S. PATENT DOCUMENTS

| | | | | |
|---|---|---|---|---|
| 4,500,845 A | * | 2/1985 | Ehni | 330/86 |
| 4,970,470 A | * | 11/1990 | Gosser | 330/252 |
| 5,150,074 A | * | 9/1992 | Gosser | 330/263 |
| 5,442,321 A | | 8/1995 | Bayruns et al. | 330/283 |
| 5,510,734 A | * | 4/1996 | Sone | 324/65 |
| 5,521,553 A | * | 5/1996 | Butler | 330/265 |
| 5,581,212 A | * | 12/1996 | Huang et al. | 330/253 |
| 5,606,288 A | * | 2/1997 | Prentice | 330/260 |
| 6,262,633 B1 | * | 7/2001 | Close | 330/267 |
| 6,297,701 B1 | * | 10/2001 | Visocchi et al. | 330/308 |

OTHER PUBLICATIONS

"Maxim Upstream CATV Amplifier", MAX3510 data sheet, Maxim Integrated Products, Sunnyvale, California, 8/99.

* cited by examiner

*Primary Examiner*—Timothy P. Callahan
*Assistant Examiner*—Hai L. Nguyen
(74) *Attorney, Agent, or Firm*—Koppel, Jacobs, Patrick & Heybl

(57) ABSTRACT

Transimpedance amplifiers are provided that generate low-distortion output voltage signals with simple, inexpensive structures that are compatible with integrated-circuit fabrication processes. The amplifiers include a current processor and a complementary output stage. The processor provides in-phase upper and lower current signals in response to a differential input current signal and differentially alters respective first and second amplitudes of these signals in response to a common-mode input current signal. The complementary output stage has upper and lower transistors that provide the output voltage signal in respective response to the upper and lower current signals and with distortion that is reduced by the altered first and second amplitudes.

21 Claims, 4 Drawing Sheets

LOW-DISTORTION TRANSIMPEDANCE AMPLIFIER STRUCTURES AND METHODS

BACKGROUND OF THE INVENTION

1. Field of the Invention

The present invention relates generally to transimpedance amplifiers.

2. Description of the Related Art

Transimpedance amplifiers typically deliver a single-ended output voltage signal in response to a differential input current signal. For effective use in a variety of systems (e.g., cable communication systems and optical transmission systems), they must generally drive low-impedance loads and provide output signals with extremely low distortion (e.g., harmonic spectral lines reduced <50 dB below the carrier).

In order to meet these requirements, the output circuit of an exemplary upstream cable modem amplifier comprises a differential pair of transistors and a 2:1 (voltage ratio) transformer. A resistor across the collectors of the differential pair provides a nominal output impedance of 300 ohms and the transformer is required to provide a single-ended output, to match this output to a 75 ohm load and to maintain an acceptable bandwidth. The output circuit of another exemplary transimpedance amplifier requires a complex feedback system that comprises a number of diodes, resistors, capacitors and transistors.

In contrast to these exemplary amplifiers, a preferred transimpedance amplifier should provide a low-distortion output voltage signal across low-impedance loads and be formed with simple, small, inexpensive and reliable structures that are compatible with integrated-circuit fabrication processes.

SUMMARY OF THE INVENTION

The present invention is directed to transimpedance amplifiers that generate low-distortion output voltage signals with simple, inexpensive structures that are compatible with integrated-circuit fabrication processes.

These amplifiers include a current processor and a complementary output stage. The processor provides in-phase upper and lower current signals $S_{upr}$ and $S_{lwr}$ in response to a differential input current signal $S_{diff}$ and alters amplitudes of these signals in response to a common-mode input current signal $S_{cm}$. The complementary output stage has upper and lower transistors that provide the output voltage signal in respective response to the upper and lower current signals and with distortion that is reduced by the altered first and second amplitudes. The common-mode input current signal $S_{cm}$ can be set to a predetermined value.

The novel features of the invention are set forth with particularity in the appended claims. The invention will be best understood from the following description when read in conjunction with the accompanying drawings.

DETAILED DESCRIPTION OF THE INVENTION

Figure 1:
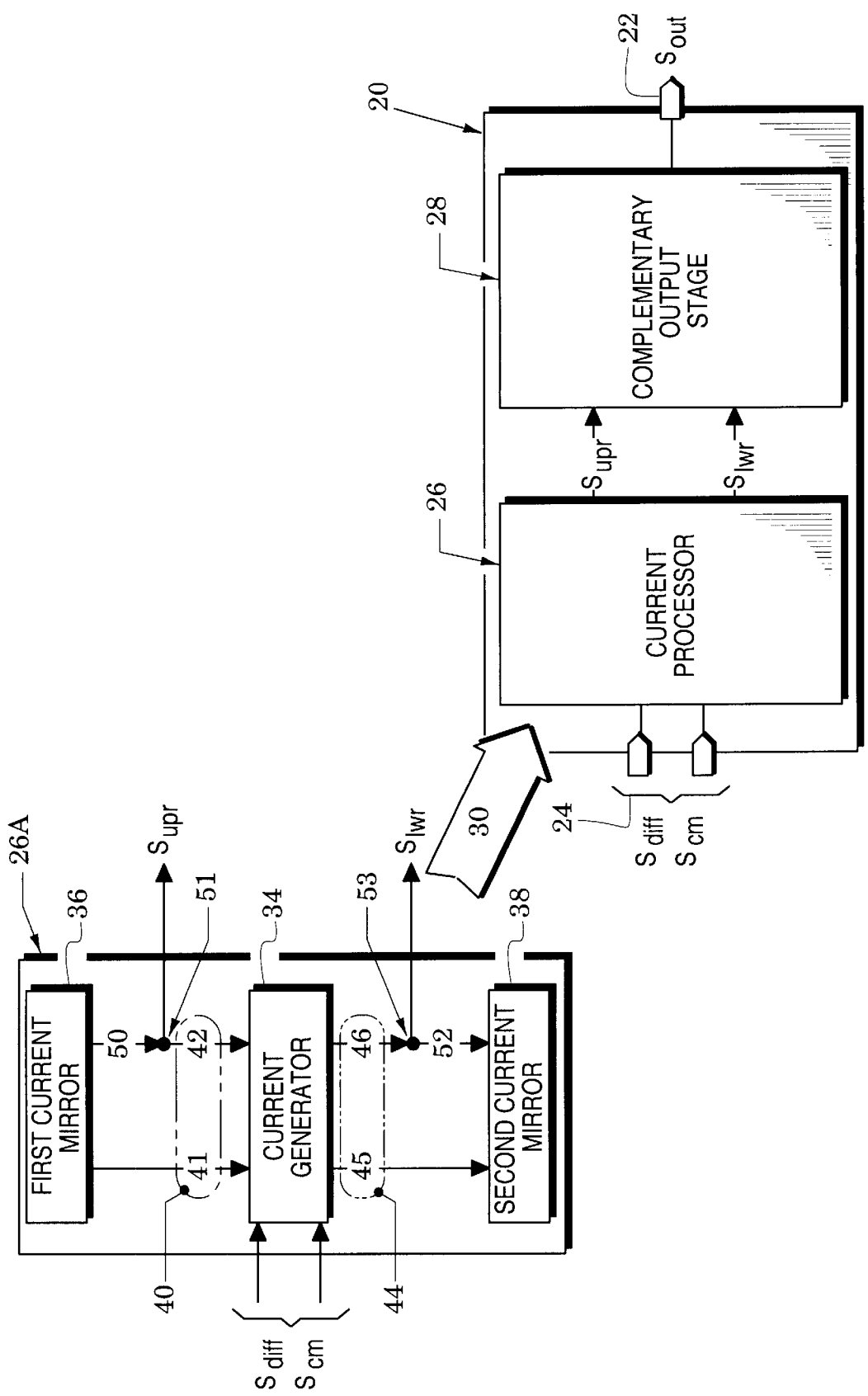
FIG. 1 is a block diagram of a transimpedance amplifier of the present invention and of an embodiment of a current processor in the amplifier.

FIG. 1 illustrates a low-distortion transimpedance amplifier 20 that generates an output voltage signal $S_{out}$ at an output port 22 in response to a differential input current signal $S_{diff}$ and a common-mode input current signal $S_{cm}$ that are applied at a differential input port 24. The transimpedance amplifier includes a current processor 26 that receives the signals $S_{diff}$ and $S_{cm}$ and a complementary output stage 28 that generates the output voltage signal $S_{out}$ in response to the current processor.

In particular, the current processor 26 responds to the differential input current signal $S_{diff}$ by providing in-phase upper and lower current signals $S_{upr}$ and $S_{lwr}$ that drive the complementary output stage 28. The current processor 26 also responds to the common-mode input current signal $S_{cm}$ by differentially altering respective amplitudes of the upper and lower current signals $S_{upr}$ and $S_{lwr}$ to thereby reduce harmonic distortion in the complementary output stage 28. If desired, the common-mode input current signal $S_{cm}$ can be set to a predetermined value that best reduces the distortion.

Accordingly, the transimpedance amplifier 20 replaces prior art output structures (e.g., transformers) that have undesirable characteristics (e.g., expensive, large size and unreliable) with complementary transistor structures that have desirable characteristics (e.g., inexpensive, small, reliable and compatible with integrated circuit processes) and provides structure and method that realizes low harmonic distortion.

FIG. 1 also shows a current processor embodiment 26A which can be substituted in the transimpedance amplifier 20 as indicated by substitution arrow 30. This embodiment includes a current generator 34 positioned between a first current mirror 36 and a second current mirror 38. In response to the differential input current signal $S_{diff}$, the current generator provides first and second differential currents 40 and 44 wherein the first differential current 40 comprises first and second currents 41 and 42 and the second differential current 44 comprises third and fourth currents 45 and 46.

The first current mirror 36 mirrors the first current 41 to thereby generate a first mirrored current 50 that is differenced with the second current 42 at an upper current node 51. The upper current signal $S_{upr}$ is therefore the difference between the first mirrored current 50 and the second current 42. Similarly, the second current mirror 38 mirrors the third current 45 to thereby generate a second mirrored current 52 that is differenced with the fourth current 46 at a lower current node 53. The lower current signal $S_{lwr}$ is therefore the difference between the second mirrored current 52 and the fourth current 46.

The current generator 34 is biased to maintain constant internal bias currents that respectively couple the first and third currents 41 and 45 and couple the second and fourth currents 42 and 46. Accordingly, when a first side of the differential input current signal $S_{diff}$ induces a current increase δi in the first current 41, the internal current bias insures that the third current 45 has a corresponding current loss δi. Corresponding responses occur between the second current signal 42 and the fourth current signal 46 except they are substantially 180° out of phase with the responses in the first and third currents because they are responsive to the other side of the differential input current signal $S_{diff}$.

Consequently, the first and second currents 41 and 42 form the first differential current 40, the third and fourth currents 45 and 46 form the second differential current 44, the first and fourth currents 41 and 46 are substantially in phase and the second and third currents 42 and 45 are also substantially in phase.

Assuming the first and second current mirrors are 1:1 current mirrors, the first mirrored current 50 substantially equals the first current 41. A current increase δi in the first current 41, therefore, mirrors a current increase δi in the first mirrored current 50 and is accompanied by a corresponding current decrease $i_s$ in the second current signal 42. Consequently, a current of 2δi flows from the upper current node 51 and forms the upper current signal $S_{upr}$.

Because the second and third currents are in phase, the current decrease $i_s$ in the second current 42 is accompanied by a current decrease δi in the third current 45. This latter current decrease δi mirrors a current decrease δi in the second mirrored current 52 and is accompanied by a corresponding current increase δi in the fourth current signal 46. Consequently, a current of 2δi also flows from the current node 53 and forms the lower current signal $S_{lwr}$. The current processor 26A, therefore, provides in-phase upper and lower current signals $S_{upr}$ and $S_{lwr}$ whose amplitudes substantially match the amplitude of the differential input current signal $S_{diff}$ (i.e., their amplitudes are substantially twice the signal amplitudes at each side of the differential input port 24).

If the common-mode input current signal $S_{cm}$ sources a current ΔI into the current generator 34, it will cause a current increase ΔI in the third and fourth currents 45 and 46 and, because of the constant internal bias currents, a corresponding current decrease ΔI in the first and second currents 41 and 42. The current decrease ΔI in the first current 41 mirrors a current decrease ΔI in the first mirrored current 50 so that current changes cancel at the upper current node 51 and, therefore, the common-mode input current signal $S_{cm}$ does not directly alter the upper current signal $S_{upr}$. Similarly, the current increase ΔI in the third current 45 mirrors a current increase ΔI in the second mirrored current 52 so that current changes also cancel at the lower current node 53 and, therefore, the common-mode input current signal $S_{cm}$ does not directly alter the lower current signal $S_{lwr}$.

However, the increased current flows in the third and fourth currents 45 and 46 effect impedance decreases in transistors associated with these currents and the decreased current flows in the first and second currents 41 and 42 effect impedance increases in transistors associated with these currents. These impedance changes steer current portions from the first differential current 40 to the second differential current 44. Accordingly, the amplitude of the lower current signal $S_{lwr}$ is increased and the amplitude of the upper current signal $S_{upr}$ is correspondingly decreased. This amplitude change can be reversed by reversing the common-mode input current signal $S_{cm}$, i.e., by sinking a current ΔI from the current generator 34 rather than inserting a current ΔI.

Transistors in the upper portion of the complementary output stage 28 differ in polarity from transistors in the lower portion and, accordingly, they differ in their production of distortion signals when responding to like amplitude signals. The current processor 26A facilitates, therefore, a distortion reduction in the output voltage signal $S_{out}$ because it can realize an appropriate amplitude difference in the upper current signal $S_{upr}$ and the lower current signal $S_{lwr}$ in response to a corresponding change in the common-mode input current signal $S_{cm}$.

Figure 2:
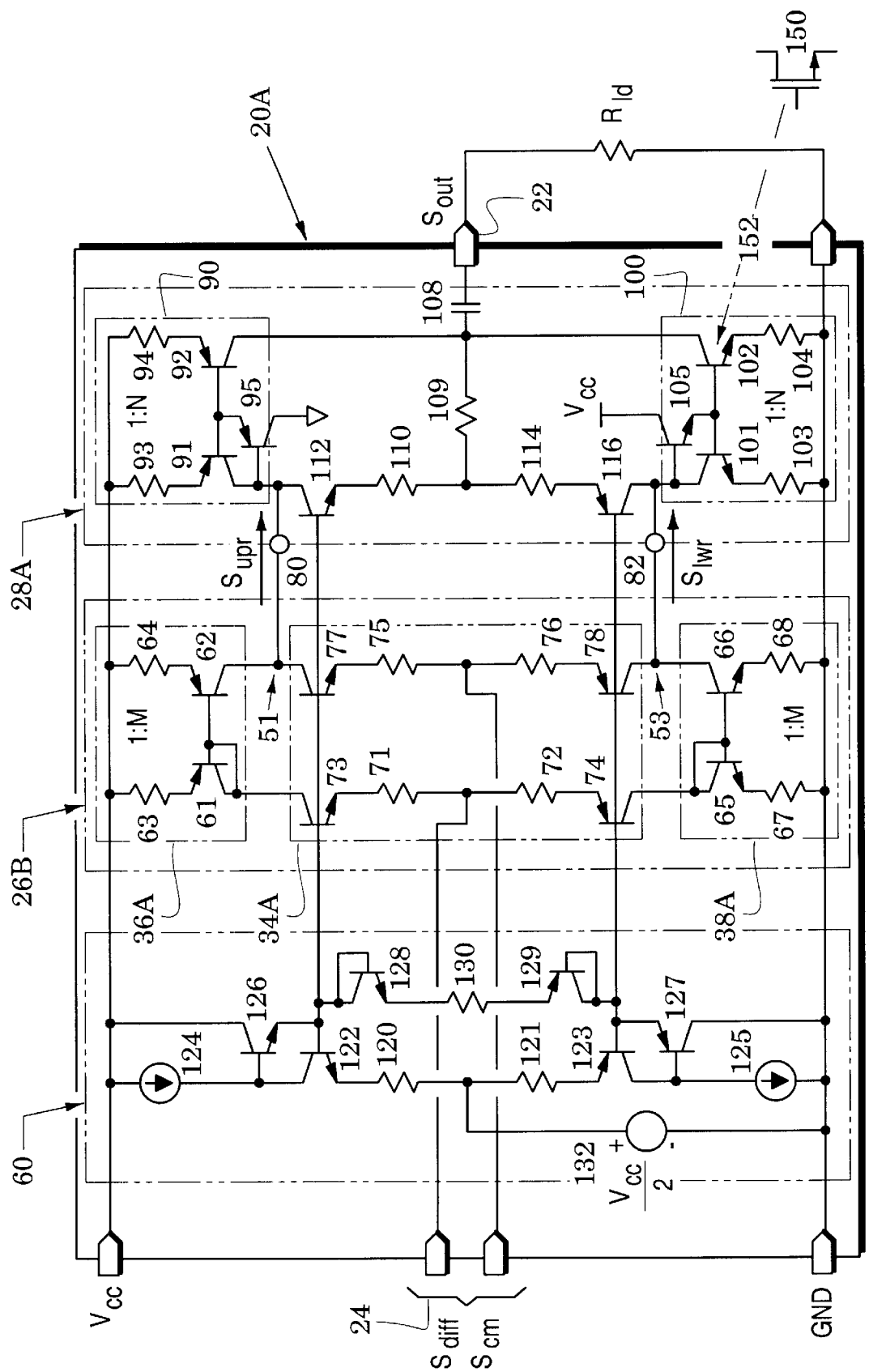
FIG. 2 is a schematic of another embodiment of the transimpedance amplifier of FIG. 1.

An understanding of the structure and operation of the transimpedance amplifier 20 is further enhanced by directing attention to the transimpedance amplifier embodiment 20A of FIG. 2. This embodiment includes a current bias generator 60, a current processor 26B and a complementary output stage 28A.

The current processor 26B positions a current generator 34A between a first current mirror 36A and a second current mirror 38A. Although the invention may be practiced with various current mirror structures, the exemplary first current mirror of FIG. 2 has a diode-connected transistor 61 coupled base-to-base with a transistor 62 and these transistors are coupled through respective resistors 63 and 64 to a supply voltage $V_{cc}$. in addition, an exemplary second current mirror is formed with similar elements 65, 66, 67 and 68 (wherein the transistors are of opposite polarity) and is coupled to GND.

The current generator 34A includes series-coupled resistors 71 and 72 that are respectively coupled to first sides of the first and second current mirrors by cascode transistors 73 and 74 and includes series-coupled resistors 75 and 76 that are respectively coupled to second sides of the first and second current mirrors by cascode transistors 77 and 78. The junction between the resistors 71 and 72 is coupled to one side of a differential input port 24 and the junction between the resistors 75 and 76 is coupled to the other side.

A junction between the cascode transistor 77 and the current mirror transistor 62 is the upper current node (51 in FIG. 1) and the junction between the cascode transistor 78 and the current mirror transistor 66 is the lower current node (53 in FIG. 1). From these nodes, the upper current $S_{upr}$ and the lower current $S_{lwr}$ pass through respective ports 80 and 82 to the complementary output stage 28A.

The complementary output stage 28A includes an exemplary upper current mirror 90 that has an input transistor 91 base-coupled to an output transistor 92 and these transistors are respectively coupled to $V_{cc}$ through resistors 93 and 94. To enhance the current mirror's mirror accuracy, the input transistor 91 is diode-connected by a boost transistor 95. The complementary output stage 28A includes similar elements 100, 101, 102, 103, 104 and 105 except the transistors are of opposite polarity.

The output transistors 92 and 102 are complementarily coupled to provide the output voltage signal $S_{out}$ to an output port 22 through a coupling capacitor 108. A feedback resistor 109 is coupled back to the amplifier port 80 via a resistor 110 and a cascode transistor 112 and is also coupled back to the amplifier port 82 via a resistor 114 and a cascode transistor 116.

The current bias generator 60 includes series-connected resistors 120 and 121 that are coupled between $V_{cc}$ and GND by bias transistors 122 and 123 and current sources 124 and 125. The bias transistors are respectively diode-connected by boost transistors 126 and 127 which are respectively coupled to $V_{cc}$ and GND. Leakage current to insure sufficient current flow through the boost transistors 126 and 127 is provided by a series connection of diode-connected transistors 128 and 129 and resistor 130. Finally, a bias voltage (e.g., $V_{cc}/2$) is established between the resistors 120 and 121 by a voltage source 132.

In operation of the transimpedance amplifier 20A, the current generator 34A establishes a bias current through resistors 120 and 121 and a bias voltage (e.g., $V_{cc}/2$) at their common junction. Cascode transistors 73 and 74, 77 and 78 and 112 and 116 form "floating current mirrors" that mirror the bias current and the bias voltage to resistors 71 and 72, 75 and 76 and 110 and 114. These mirrors maintain constant internal bias currents in the current generator 34A so that a current increase δi in cascode transistor 73 imposes a substantially equal current decrease δi in cascode transistor 74. Because of the differential current drive at the input port 24, these increases and decreases will be accompanied by a current decrease δi in cascode transistor 77 and a current increase δi in cascode transistor 78.

In response, mirror transistor 62 of the current mirror 36A will provide a current increase δi to the differencing node 51 and, accordingly, the upper current signal $S_{upr}$ has a current increase 2δi. At the same time, mirror transistor 66 of the current mirror 38A will provide a current decrease δi to the differencing node 53 and, accordingly, the lower current signal $S_{lwr}$ also has a current increase 2δi. In response to the differential input current signal $S_{diff}$, therefore, the current processor 26B supplies in-phase upper and lower currents $S_{upr}$ and $S_{lwr}$ that substantially equal $S_{diff}$ (i.e., their amplitudes substantially equal the signal amplitudes at each side of the differential input port 24).

A positive common-mode input current signal $S_{cm}$ at the input port 24 of FIG. 2 will decrease currents through cascode transistors 73 and 77 and increase currents through cascode transistors 74 and 78. Because these changes in cascode transistors 73 and 77 are in the same direction, a current cancellation will occur at the difference node 51 between the current through cascode transistor 77 and a mirrored current from mirror transistor 62. A similar current cancellation will occur at the difference node 53 and, as a result, the common-mode input current signal $S_{cm}$ does not directly effect a direct current (dc) change in the upper and lower current signals $S_{upr}$ and $S_{lwr}$.

A positive common-mode input current signal $S_{cm}$ will, however, effect a change in the input impedances of the cascode transistors 73, 74, 77 and 78. The emitter impedance of each of these transistors approximates $1/g_m$ which equals $kT/qI_c$ wherein $g_m$ is transistor transconductance, k is Boltzmann's constant, T is degrees Kelvin, q is electron charge and $I_c$ is collector current. A current increase in cascode transistors 74 and 78 will, therefore, lower their emitter resistances while a current decrease in cascode transistors 73 and 77 will raise their emitter resistances.

Assuming that resistors 71, 72, 75 and 76 have equal resistance, this difference in emitter resistances steers a greater portion of the differential input current signal $S_{diff}$ through the lower-impedance cascode transistors 74 and 78 than through the higher-impedance cascode transistors 71 and 75. Accordingly, the lower current $S_{lwr}$ is somewhat increased and the upper current $S_{upr}$ is decreased by a like amount.

Because the complementary output transistors 92 and 102 have finite Early voltages $V_a$, their output impedances $V_a/I_c$ (in which $I_c$ is instantaneous collector current) include second-order nonlinearities and this nonlinearity increases as the Early voltage $V_a$ decreases. A substantial voltage swing generally occurs across the collectors of output transistors 92 and 102 and this voltage swing across nonlinear output impedances in combination with the output current swing causes nonlinear variations of transistor output impedance $R_o$. These variations result in 2nd order harmonic distortions in the output voltage signal $S_{out}$ at the output port 22. These distortions increase with Early voltage $V_a$ differences in different transistor types.

For example, PNP transistors typically have lower Early voltages than do NPN transistors so, for the same voltage swing, output transistor 92 will produce more distortion than output transistor 102. The greater distortion of the output transistor 92 can be reduced, however, by steering a greater portion of the signal currents generated in the current processor 26B to the output transistor 102.

The invention therefore realizes that harmonic distortion in the complementary output stage 28A can be substantially controlled via the amplitudes of the upper and lower current signals $S_{upr}$ and $S_{lwr}$ and these amplitudes, in turn, can be controlled by the common-mode input current signal $S_{cm}$. Accordingly, harmonic distortion of the transimpedance amplifier 20A is reduced by an appropriate selection of the common-mode input current signal $S_{cm}$ (which can be set, for example, to a predetermined level).

It was previously assumed that the current mirrors 90 and 100 of the complementary output stage 28A were 1:1 current mirrors. With appropriate selection of transistor sizes and resistor values, however, current mirrors 90 and 100 can be set to mirror currents that are N times greater than their corresponding input currents.

In general, therefore, the in-phase upper and lower current signals $S_{upr}$ and $S_{lwr}$ (prior to adjustments effected by the common-mode input current signal $S_{cm}$) are equal to $(1/2)S_{diff}$ and currents out of the complementary output transistors 92 and 102 are equal to $(N/2)S_{diff}$. Harmonic distortion in the transimpedance amplifier 20A is reduced because these currents are differentially altered by application of an appropriate common-mode input current signal $S_{cm}$ which changes transistor impedances in the current generator 34A.

Feedback through the feedback resistor 109 sets the output impedance $Z_{out}$ of the transimpedance amplifier 20A to be substantially equal to the impedance of the feedback resistor $Z_{109}$ divided by N+1 wherein N is the current gain of the current mirrors 90 and 100. Thus, the output impedance $Z_{out}$ of the transimpedance amplifier 20A can be adjusted to substantially match the load impedance $R_{ld}$.

Figure 3:
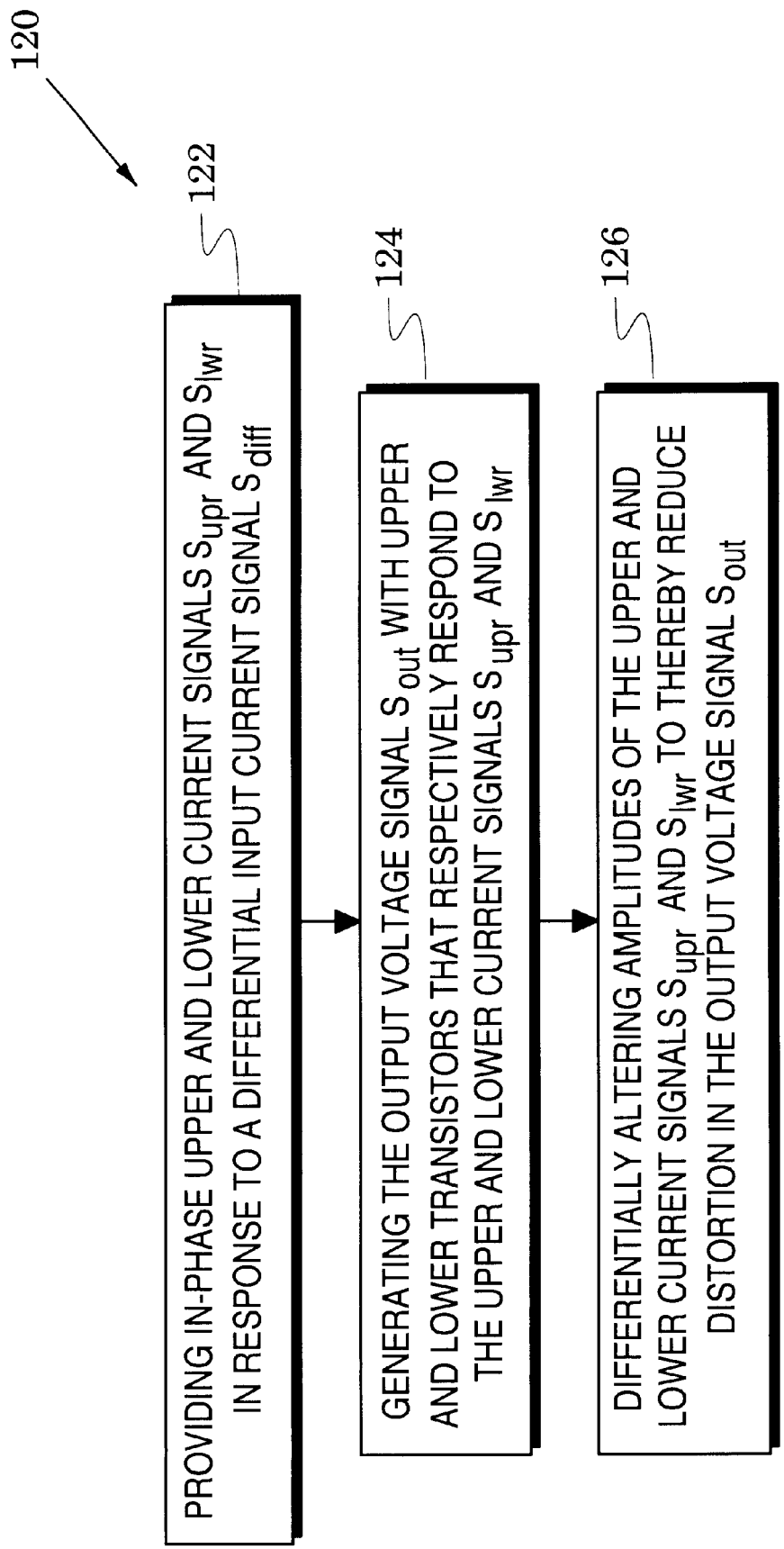
FIG. 3 is a flow chart that illustrates transimpedance process steps that can be practiced with the amplifiers of FIGS. 1 and 2.

The flow chart 120 of FIG. 3 illustrates process steps that can be practiced with the transimpedance amplifiers of FIGS. 1 and 2. In particular, the flow chart 120 shows process steps in a method for generating a low-distortion output voltage signal $S_{out}$ in response to a differential input current signal $S_{diff}$.

In a first process step 122, in-phase upper and lower current signals $S_{upr}$ and $S_{lwr}$ are provided in response to the differential input current signal $S_{diff}$. The output voltage signal $S_{out}$ is generated in process step 124 with complementary upper and lower transistors that respectively respond to the upper and lower current signals $S_{upr}$ and $S_{lwr}$. Finally, first and second amplitudes of the upper and lower current signals $S_{upr}$ and $S_{lwr}$ are altered in process step 126 to thereby reduce distortion in the output voltage signal $S_{out}$.

Figure 4:
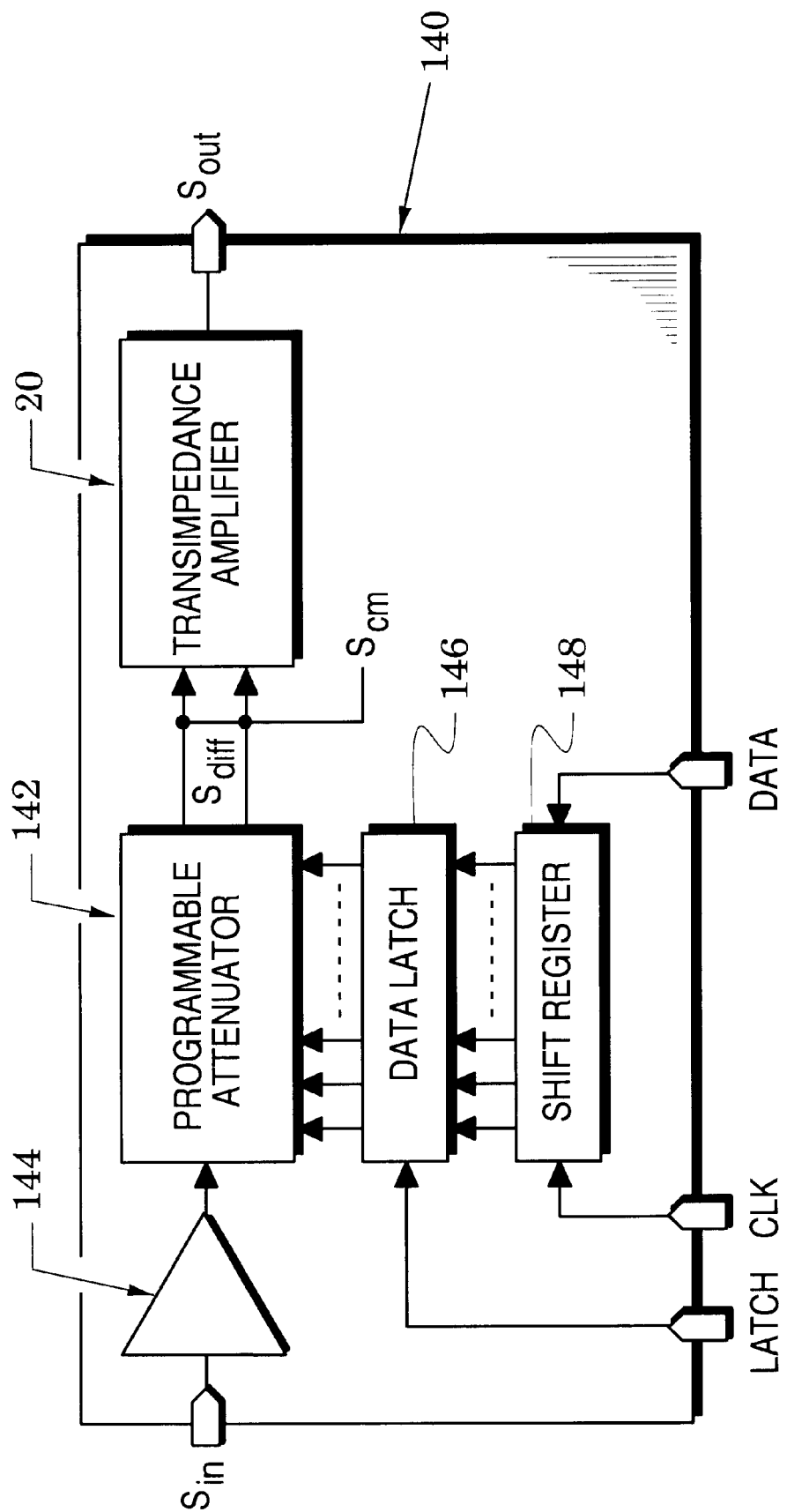
FIG. 4 is a block diagram of a programmable amplifier of the present invention that includes the transimpedance amplifier of FIG. 1.

FIG. 4 illustrates a programmable amplifier 140 that positions a programmable attenuator 142 between an input buffer amplifier 144 and the transimpedance amplifier 20 of FIG. 1. Attenuation of the programmable attenuator is set by a digital word that is applied from a data latch 146 which receives the digital word from a shift register 148 in response to a latch signal at a latch port. Words are applied to a data port of the shift register and clocked into the shift register in response to a clock signal applied to a clock port.

The buffer amplifier 144 isolates the programmable attenuator 142 from input impedance changes and provides a low noise signal to the programmable attenuator. In response, the programmable attenuator provides, to the transimpedance amplifier, a differential input signal $S_{diff}$ that has been attenuated to a level commanded by the digital word that is provided from the latch 146. The transimpedance amplifier 20 then converts the differential input signal $S_{diff}$ into an output voltage signal $S_{out}$ in previously-described processes. The programmable amplifier 140 thus comprises a low-noise fixed amplifier, a digitally-controlled attenuator and a low-distortion high-power amplifier.

The transimpedance amplifiers and programmable amplifiers of the invention provide low distortion amplification and the ability to drive single-ended low-impedance loads (e.g., a 75 ohm CATV cable) without the need for large, expensive output devices (e.g., transformers). They are especially suited for use in a variety of systems (e.g., cable communication systems and optical transmission systems) and for a variety of specific amplifier applications (e.g., as upstream power amplifiers in cable modems and CATV set-top boxes).

In the transimpedance amplifier 20A of FIG. 2, output transistors 92 and 102 (of the current mirrors 90 and 100) are arranged as a complementary common emitter output stage. Other embodiments of the invention, however, may be formed with different complementary arrangements (e.g., a complementary common collector stage).

Although embodiments of the transimpedance amplifiers of the invention have been described with respect to bipolar transistors, other embodiments can be formed with different transistors (e.g., metal oxide transistors as exemplified in FIG. 2 by the metal oxide transistor 150 and the substitution arrow 152).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A low-distortion transimpedance amplifier that generates an output voltage signal in response to a differential input current signal and a common-mode input current signal, comprising:

a current processor that provides in-phase upper and lower current signals in response to said differential input current signal and differentially alters respective first and second amplitudes of said upper and lower current signals in response to said common-mode input current signal; and a complementary output stage having upper and lower transistors that provide said output voltage signal in respective response to said upper and lower current signals;

wherein said current processor includes:

a current generator that generates, in response to said differential input current signal, a first differential current signal that comprises first and second currents and a second differential current signal that comprises third and fourth currents with said fourth current substantially in phase with said first current and that differentially alters, in response to said common-mode input current signal, the amplitudes of said differential first and second current signals;

a first current mirror that mirrors said first current of said first differential current signal to thereby provide a first mirrored current that is differenced with said second current of said first differential current signal to generate said upper current signal; and a second current mirror that mirrors said third current of said second differential current signal to thereby provide a second mirrored current that is differenced with said fourth current of said second differential current signal to generate said lower current signal;

and wherein:

said current generator includes first and second transistors that respectively provide said first and second currents to said first current mirror and third and fourth transistors that respectively provide said third and fourth currents to said second current mirror;

said first and third transistors are biased to carry a first bias current; and said third and fourth transistors are biased to carry a second bias current that substantially equals said first bias current signal;

distortion in said output voltage signal thereby reduced by differentially altered first and second amplitudes.

2. The transimpedance amplifier of claim 1, further including a bias generator that generates said first and second bias currents.

3. A low-distortion transimpedance amplifier that generates an output voltage signal in response to a differential input current signal and a common-mode input current signal, comprising:

a current processor that provides in-phase upper and lower current signals and in response to said differential input current signal and differentially alters respective first and second amplitudes of said upper and lower current signals in response to said common-mode input current signal; and a complementary output stage having upper and lower transistors that provide said output voltage signal in respective response to said upper and lower current signals;

wherein said complementary output stage comprises upper and lower current mirrors that respectively include said upper and lower transistors and respectively receive said upper and lower current signals;

distortion in said output voltage signal thereby reduced by differentially altered first and second amplitudes.

4. The transimpedance amplifier of claim 3, wherein said upper and lower transistors are bipolar junction transistors.

5. The transimpedance amplifier of claim 3, wherein said upper and lower transistors are field effect transistors.

6. The transimpedance amplifier of claim 3, wherein said upper and lower current mirrors are 1:1 current mirrors.

7. The transimpedance amplifier of claim 3, wherein said upper and lower transistors are arranged as a complementary common emitter stage.

8. The transimpedance amplifier of claim 3, wherein said upper and lower transistors are arranged as a complementary common collector stage.

9. The transimpedance amplifier of claim 3, wherein said complementary output stage forms a feedback path that couples a portion of said output voltage signal to said upper and lower current signals.

10. A variable-gain amplifier that generates a programmable output signal in response to an input signal and a common-mode input current signal, comprising:

a programmable attenuator that converts said input signal to a differential input current signal with a programmable amplitude;

a current processor that provides in-phase upper and lower current signals and in response to said differential input current signal and differentially alters respective first and second amplitudes of said upper and lower current signals in response to said common-mode input current signal; and a complementary output stage having upper and lower transistors that provide said output voltage signal in respective response to said upper and lower current signals;

wherein said complementary output stage comprises upper and lower current mirrors that respectively include said upper and lower transistors and respectively receive said upper and lower current signals;

distortion in said output voltage signal thereby reduced by differentially altered first and second amplitudes.

11. The amplifier of claim 10, wherein said programmable attenuator adjusts its attenuation in response to a digital signal and further including:

a data register that receives said digital word; and a data latch that presents said digital word to said programmable attenuator.

12. The amplifier of claim 10, further including a buffer amplifier that precedes said programmable attenuator.

13. A low-distortion transimpedance amplifier that generates an output voltage signal in response to a differential input current signal and a common-mode input current signal, comprising:

a current generator that:
 a) generates, in response to said differential input current signal, a first differential current signal that is formed by a first and a second current and a second differential current signal that is formed by a third and a fourth current which is substantially in phase with said first current; and
 b) differentially alters, in response to said common-mode input current signal, respective first and second amplitudes of said differential first and second current signals;

a first current mirror that mirrors said first current to provide a first mirrored current that is summed with said second current to generate an upper current signal;

a second current mirror that mirrors said third current to provide a second mirrored current that is summed with said fourth current to generate a lower current signal; and a complementary output stage having upper and lower transistors that provide said output voltage signal in respective response to said upper and lower current signals;

wherein:
 said current generator includes first and second transistors that respectively provide said first and second currents to said first current mirror and third and fourth transistors that respectively provide said third and fourth currents to said second current mirror;
 said first and third transistors are biased to carry a first bias current; and
 said third and fourth transistors are biased to carry a second bias current that substantially equals said first bias current;
 distortion in said output voltage signal thereby reduced by differentially altered first and second amplitudes.

14. The transimpedance amplifier of claim 13, wherein said upper and lower transistors are arranged as a complementary common emitter stage.

15. The transimpedance amplifier of claim 13, wherein said complementary output stage includes a resistor that adds a feedback signal to said upper and lower current signals in response to said output voltage signal.

16. A low-distortion transimpedance amplifier that generates an output voltage signal in response to a differential input current signal and a common-mode input current signal, comprising:

a current generator that:
 a) generates, in response to said differential input current signal, a first differential current signal that is formed by a first and a second current and a second differential current signal that is formed by a third and a fourth current which is substantially in phase with said first current; and
 b) differentially alters, in response to said common-mode input current signal, respective first and second amplitudes of said differential first and second current signals;

a first current mirror that mirrors said first current to provide a first mirrored current that is summed with said second current to generate an upper current signal;

a second current mirror that mirrors said third current to provide a second mirrored current that is summed with said fourth current to generate a lower current signal; and a complementary output stage having upper and lower transistors that provide said output voltage signal in respective response to said upper and lower current signals;

wherein said complementary output stage comprises upper and lower current mirrors that respectively include said upper and lower transistors and respectively receive said upper and lower current signals;

distortion in said output voltage signal thereby reduced by differentially altered first and second amplitudes.

17. The transimpedance amplifier of claim 16, wherein said upper and lower transistors are arranged as a complementary common emitter stage.

18. The transimpedance amplifier of claim 16, wherein said complementary output stage includes a resistor that adds a feedback signal to said upper and lower current signals in response to said output voltage signal.

19. A variable-gain amplifier that generates a programmable output signal in response to an input signal and a common-mode input current signal, comprising:

a programmable attenuator that converts said input signal to a differential input current signal with a programmable amplitude;

a current processor that provides in-phase upper and lower current signals in response to said differential input current signal and differentially alters respective first and second amplitudes of said upper and lower current signals in response to said common-mode input current signal; and a complementary output stage having upper and lower transistors that provide said output voltage signal in respective response to said upper and lower current signals;

wherein said current processor includes:
 a current generator that generates, in response to said differential input current signal, a first differential current signal that comprises first and second currents and a second differential current signal that comprises third and fourth currents with said fourth current substantially in phase with said first current and that differentially alters, in response to said common-mode input current signal, the amplitudes of said differential first and second current signals;

a first current mirror that mirrors said first current of said first differential current signal to thereby provide a first mirrored current that is differenced with said second current of said first differential current signal to generate said upper current signal; and a second current mirror that mirrors said third current of said second differential current signal to thereby provide a second mirrored current that is differenced with said fourth current of said second differential current signal to generate said lower current signal;

and wherein:

said current generator includes first and second transistors that respectively provide said first and second currents to said first current mirror and third and fourth transistors that respectively provide said third and fourth currents to said second current mirror;

said first and third transistors are biased to carry a first bias current; and said third and fourth transistors are biased to carry a second bias current that substantially equals said first bias current;

differentially altered first and second amplitudes reducing distortion in said output voltage signal.

20. The amplifier of claim 19, wherein said programmable attenuator adjusts its attenuation in response to a digital signal and further including:

a data register that receives said digital word; and a data latch that presents said digital word to said programmable attenuator.

21. The amplifier of claim 19, further including a buffer amplifier that precedes said programmable attenuator.

* * * * *